(12) United States Patent
Kim

(10) Patent No.: US 7,785,975 B2
(45) Date of Patent: Aug. 31, 2010

(54) SOI DEVICE WITH IMPROVED STORAGE CAPACITY AND METHOD FOR MANUFACTURING THE SAME

(75) Inventor: Bo Youn Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/183,117

(22) Filed: Jul. 31, 2008

(65) Prior Publication Data

US 2009/0278202 A1    Nov. 12, 2009

(30) Foreign Application Priority Data

May 7, 2008    (KR) .................... 10-2008-0042256

(51) Int. Cl.
*H01L 21/331*    (2006.01)

(52) U.S. Cl. ................ 438/311; 438/221; 438/222; 438/226; 438/294; 257/347; 257/E27.112; 257/E21.32; 257/E21.545

(58) Field of Classification Search .......... 257/347, 257/E27.112, E21.32, E21.545, E21.564; 438/199, 221, 222, 226, 294, 311, FOR. 160, 438/FOR. 257

See application file for complete search history.

(56) References Cited

U.S. PATENT DOCUMENTS

| | | | | |
|---|---|---|---|---|
| 5,567,968 A | * | 10/1996 | Tsuruta et al. ............ | 257/356 |
| 5,841,172 A | * | 11/1998 | Morishita et al. ........... | 257/355 |
| 6,160,293 A | * | 12/2000 | Onishi et al. ................ | 257/347 |
| 7,071,039 B2 | * | 7/2006 | Nagano et al. .............. | 438/152 |
| 7,339,254 B1 | * | 3/2008 | Kempf ....................... | 257/577 |
| 2001/0001497 A1 | * | 5/2001 | Utsunomiya et al. ........ | 257/355 |
| 2004/0094805 A1 | * | 5/2004 | Hokazono et al. .......... | 257/382 |
| 2005/0212056 A1 | * | 9/2005 | Iwamatsu et al. .......... | 257/377 |
| 2007/0007596 A1 | * | 1/2007 | Wasshuber et al. ......... | 257/347 |
| 2007/0230234 A1 | * | 10/2007 | Ohsawa .................... | 365/150 |
| 2008/0203484 A1 | * | 8/2008 | Hofmann et al. ........... | 257/369 |
| 2008/0224209 A1 | * | 9/2008 | Chun ........................ | 257/334 |
| 2009/0200604 A1 | * | 8/2009 | Chidambarrao et al. ..... | 257/329 |

FOREIGN PATENT DOCUMENTS

KR    10-0351894 B1    9/2002

* cited by examiner

*Primary Examiner*—N Drew Richards
*Assistant Examiner*—Joannie A Garcia
(74) *Attorney, Agent, or Firm*—Ladas & Parry LLP

(57) ABSTRACT

An SOI device includes an SOI substrate composed of a stack structure of a silicon substrate, a buried oxide layer, and a silicon layer. Grooves are defined in the silicon layer each exposing the buried oxide layer. A barrier layer is formed on the lower portion of the sidewall of each of the grooves. An epi-silicon layer is formed to fill the grooves and cover the barrier layer. Gates are formed on the epi-silicon layer, and junction areas are formed in the silicon layer on both sides of the gates.

16 Claims, 5 Drawing Sheets

SOI DEVICE WITH IMPROVED STORAGE CAPACITY AND METHOD FOR MANUFACTURING THE SAME

CROSS-REFERENCE TO RELATED APPLICATIONS

The present application claims priority to Korean patent application number 10-2008-0042256 filed on May 7, 2008, which is incorporated herein by reference in its entirety.

BACKGROUND OF THE INVENTION

The present invention relates generally to a silicon-on-insulator (SOI) device and a method for manufacturing the same, and more particularly, to an SOI device which improves both the sensing margin of the floating body cell formed in an SOI substrate and the operational characteristics thereof and a method for manufacturing the same.

Semiconductor devices are constantly proceeding towards higher integration, higher operation speed, and lower power consumption. With this in mind, semiconductor devices that use an SOI substrate in place of the silicon substrate formed of bulk silicon, (that is, an SOI device) are gaining popularity. This is because the semiconductor device formed using the SOI substrate confers advantages that do not exist in the silicon substrate. Examples of these advantages include high speed operation due to a reduced junction capacity, a lower voltage requirement due to a reduced threshold voltage, and prevention of a latch-up phenomenon due to the complete isolation obtainable with the SOI substrate.

Hereinbelow, a conventional SOI device is schematically described.

An SOI substrate includes an SOI substrate composed of a stack structure of a silicon substrate, a buried oxide layer, and a silicon layer. The silicon substrate functions to support the entire SOI device, and the silicon layer serves as a layer on which the SOI device is actually formed. Gates are formed on the silicon layer of the SOI substrate, and junction areas are formed in the silicon layer on both sides of the gates. The junction areas are formed such that the lower ends thereof come into contact with the buried oxide layer. Accordingly, the portions of the silicon layer under the gates (that is, the bodies of transistors) are isolated by the junction areas and the buried oxide layer and are thereby floated.

Therefore, the SOI device has a floating body cell (FBC) in which the bodies of the transistors isolated by the junction areas and the buried oxide layer are floated. Because charges can be stored in the floated bodies, it is not necessary to form capacitors, and accordingly, it is possible to decrease the size of a cell.

However, in the conventional SOI device, when cell size is decreased in order to accommodate the trend toward high integration of a semiconductor device, the volume of the transistor body is reduced, and consequently the charge storage capacity of the body decreases. As a consequence, in the conventional SOI device, it is difficult to adjust the threshold voltage, and therefore the sensing margin of the device deteriorates.

Further, in the conventional SOI device, a punch-through phenomenon occurs between the junction areas formed on both sides of the gates, leading to deterioration in the operational characteristics of the cell transistors.

SUMMARY OF THE INVENTION

Embodiments of the present invention are directed to an SOI device which improves charge storage capacity, thereby improving a sensing margin, and a method for manufacturing the same.

Additionally, embodiments of the present invention are directed to an SOI device which prevents a punch-through phenomenon between junction areas, thereby improving the operational characteristics of the cell transistors, and a method for manufacturing the same.

In one aspect, an SOI device comprises an SOI substrate composed of a stack structure of a silicon substrate, a buried oxide layer, and a silicon layer, and having grooves which are defined in the silicon layer to expose the buried oxide layer; a barrier layer formed on lower portions of the sidewall of each of the grooves; an epi-silicon layer formed to fill the grooves including the barrier layer; gates formed on the epi-silicon layer; and junction areas formed in the silicon layer on both sides of each of the gates.

The barrier layer comprises an oxide layer.

The junction areas are formed such that lower ends thereof come into contact with the buried oxide layer.

In another aspect, a method for manufacturing an SOI device comprises the steps of etching the silicon layer of an SOI substrate, which is composed of a stack structure of a silicon substrate, a buried oxide layer, and the silicon layer, and thereby defining grooves to expose the buried oxide layer; forming a barrier layer on lower portions of the sidewall of each of the grooves; forming an epi-silicon layer to fill the grooves including the barrier layer; forming gates on the epi-silicon layer; and forming junction areas in the silicon layer on both sides of the gates.

The barrier layer comprises an oxide layer.

The step of forming a barrier layer on lower portions of sidewalls of the grooves comprises the steps of depositing a barrier layer on the silicon layer including surfaces of the grooves; etching back the barrier layer to remain on sidewalls of the grooves; and removing portions of the barrier layer which are formed on upper portions of the sidewalls of the grooves.

The step of removing portions of the barrier layer which are formed on upper portions of the sidewalls of the grooves is conducted through a cleaning process.

The epi-silicon layer is formed through an SEG process.

The junction areas are formed such that lower ends thereof come into contact with the buried oxide layer.

DESCRIPTION OF SPECIFIC EMBODIMENTS

In the present invention, after forming an insulation layer on the lower portions of the sidewalls of the grooves defined in a silicon layer, an epi-silicon layer is formed to fill the grooves including the insulation layer. As such, in the present invention, the charge storage capacity of an SOI device is improved, leading to an improvement in the sensing margin.

Additionally, in the present invention, a punch-through phenomenon between junction areas can be prevented due to the presence of the insulation layer formed on the lower portions of the sidewalls of the grooves, and thus, the operational characteristics of the cell transistors is improved.

Hereafter, specific embodiments of the present invention are described with reference to the attached drawings.

Figure 1:
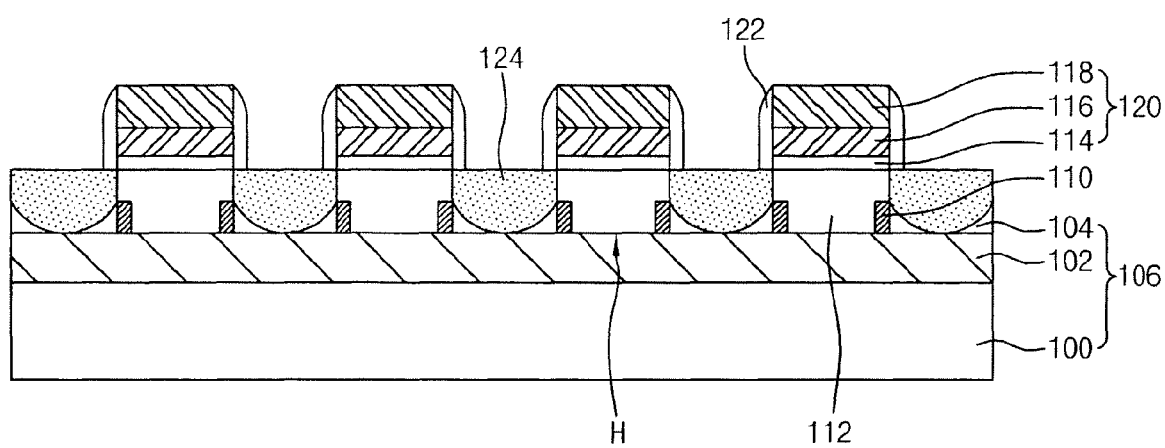
FIG. 1 is a cross-sectional view showing an SOI device in accordance with an embodiment of the present invention.

FIG. 1 is a cross-sectional view showing an SOI device in accordance with an embodiment of the present invention.

Referring to FIG. 1, an SOI substrate 106, which comprises a stack structure of a silicon substrate 100, a buried oxide layer 102, and a silicon layer 104, is prepared. Grooves H are defined in the silicon layer 104 of the SOI substrate 106. Preferably, the grooves H are defined to expose the buried oxide layer 102. A barrier layer 110 is formed on the lower portions of the sidewalls of the grooves H. The barrier layer 110 can, for example, comprise an oxide layer.

An epi-silicon layer 112 is formed to fill the grooves H having the barrier layer 110 formed on the lower portions of the sidewalls thereof. Gates 120 are formed on the epi-silicon layer 112, and gate spacers 122 are formed on both sidewalls of the gates 120. Each gate 120 may, for example, comprise a stack structure of a gate insulation layer 114, a gate conductive layer 116, and a gate hard mask layer 118.

Junction areas 124 are formed in the silicon layer 104 on both sides of the gates 120 having the gate spacers 122 formed on both sidewalls thereof. Preferably, the junction areas 124 are formed in a manner such that the lower ends thereof come into contact with the buried oxide layer 102, as is shown in FIG. 1.

In the SOI device according to the present embodiment, configured as described above, the bodies of floating transistors are enlarged through the growth of the epi-silicon layer, and therefore the amount of accumulated positive charges can be increased. Accordingly, the charge storage capacity and sensing margin can be improved.

Additionally, in the SOI device according to the present embodiment, a punch-through phenomenon between the junction areas formed on both sides of the gates can be prevented due to the presence of the barrier layer formed on the lower portions of the sidewalls of the grooves, and therefore the operational characteristics of the SOI device are improved. Further, in the SOI device according to the present embodiment, the formation of the barrier layer allows for a decrease in the depth of the junction areas along with a decrease in the concentration of impurities and the amount of energy required when conducting ion implantation, and therefore the processing margin can be improved.

FIGS. 2A through 2G are cross-sectional views shown for illustrating a method for manufacturing an SOI device in accordance with another embodiment of the present invention. The method is described below.

Figure 2A:
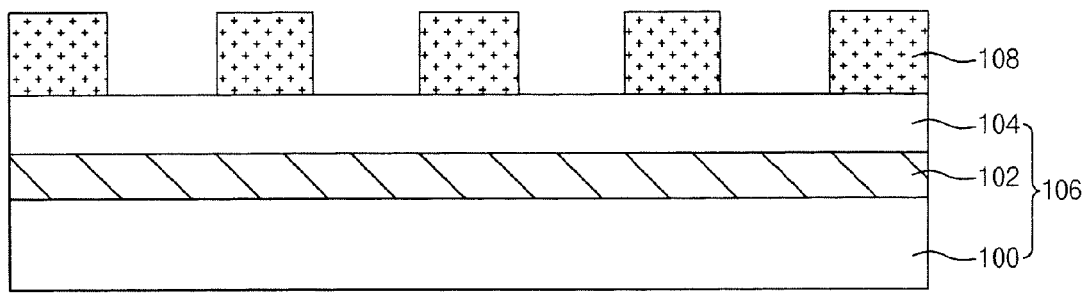
FIGS. 2A through 2G are cross-sectional views shown for illustrating a method for manufacturing an SOI device in accordance with another embodiment of the present invention.

Referring to FIG. 2A, an SOI substrate 106, which comprises a stack structure of a silicon substrate 100, a buried oxide layer 102, and a silicon layer 104, is prepared. A mask pattern 108 is formed on the SOI substrate 106 to expose portions of the silicon layer 104. Preferably, the mask pattern 108 is formed to expose the portions of the silicon layer 104 which will serve as the bodies of transistors.

Figure 2B:
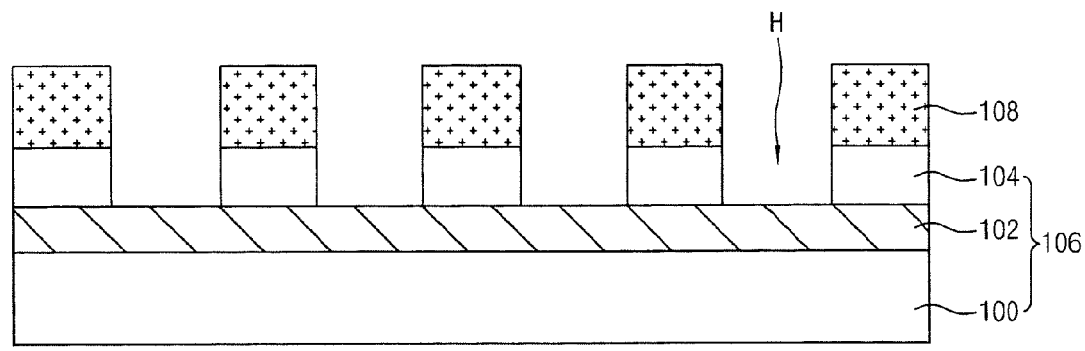

Referring to FIG. 2B the exposed portions of the silicon layer 104 are etched using the mask pattern 108 as an etch mask to define grooves H. Preferably, the grooves H are defined to expose the buried oxide layer 102, and the grooves are positioned between the portions of the silicon layer 104 which will serve as the bodies of transistors.

Figure 2C:
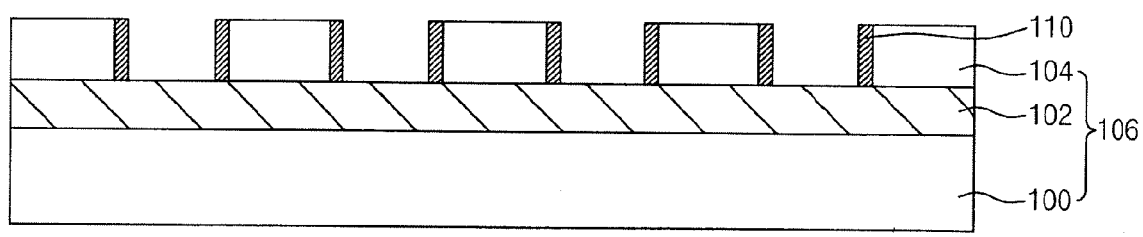

Referring to FIG. 2C, the mask pattern 108 is removed from the resultant SOI substrate 106 which having the grooves H defined therein. A barrier layer 110 is deposited on the silicon layer 104 including the surfaces of the grooves H, and the barrier layer 110 is then etched back so that it remains on the sidewalls of the grooves H as shown in FIG. 2C. The barrier layer 110 may comprise, for example, an oxide layer.

Figure 2D:
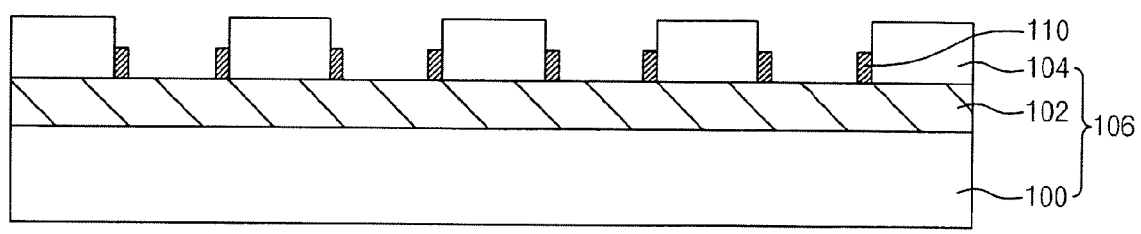

Referring to FIG. 2D, portions of the barrier layer 110 on upper portions of the sidewalls of the grooves H are selectively removed. The removal of the portions of the barrier layer 110, which are formed on the upper portions of the sidewalls of the grooves H, is conducted using a cleaning process. As a result of the cleaning process, the barrier layer 110 remains only on the lower portions of the sidewalls of the grooves H.

Figure 2E:
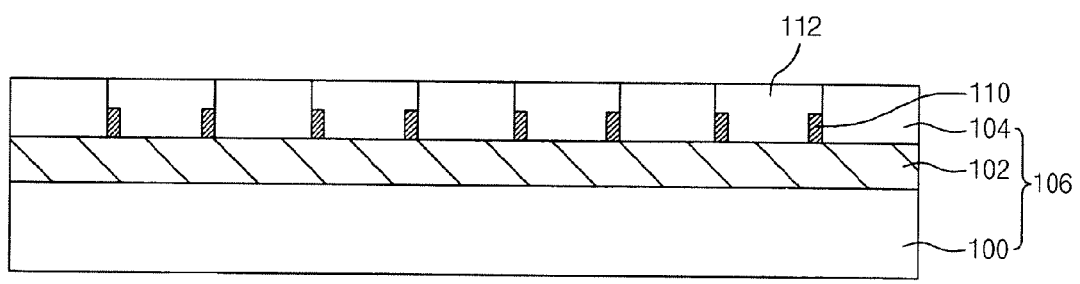

Referring to FIG. 2E, an epi-silicon layer 112 is formed on the silicon layer 104 including the grooves H to fill the grooves H having the barrier layer 110 remaining on the lower portions of the sidewalls thereof. The epi-silicon layer 112 can be formed, for example, through a selective epitaxial growth (SEG) process. The epi-silicon layer 112 is polished using, for example, a chemical mechanical polishing (CMP) process, until the silicon layer 104 is exposed.

Figure 2F:
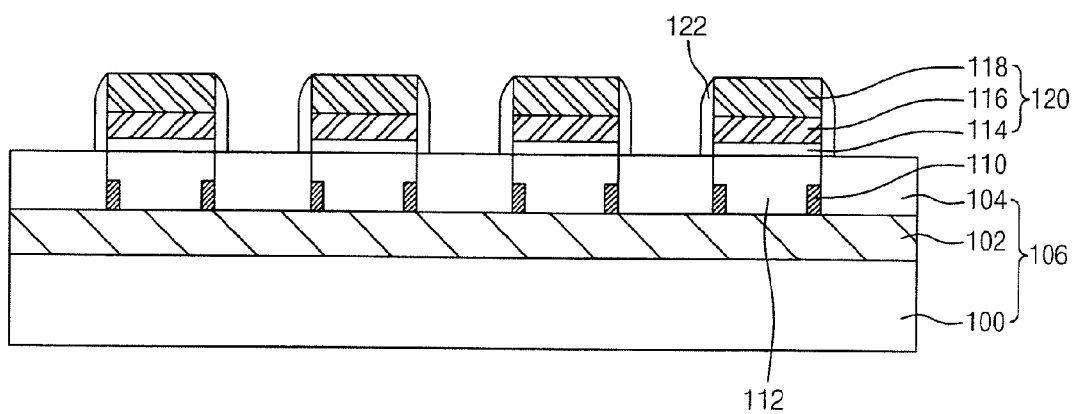

Referring to FIG. 2F, a gate insulation layer 114, a gate conductive layer 116, and a gate hard mask layer 118 are sequentially formed on the polished epi-silicon layer 112. The gate hard mask layer 118, the gate conductive layer 116, and the gate insulation layer 114 are etched to form gates 120 on the epi-silicon layer 112. Gate spacers 122 are formed on both sidewalls of the gates 120.

Figure 2G:
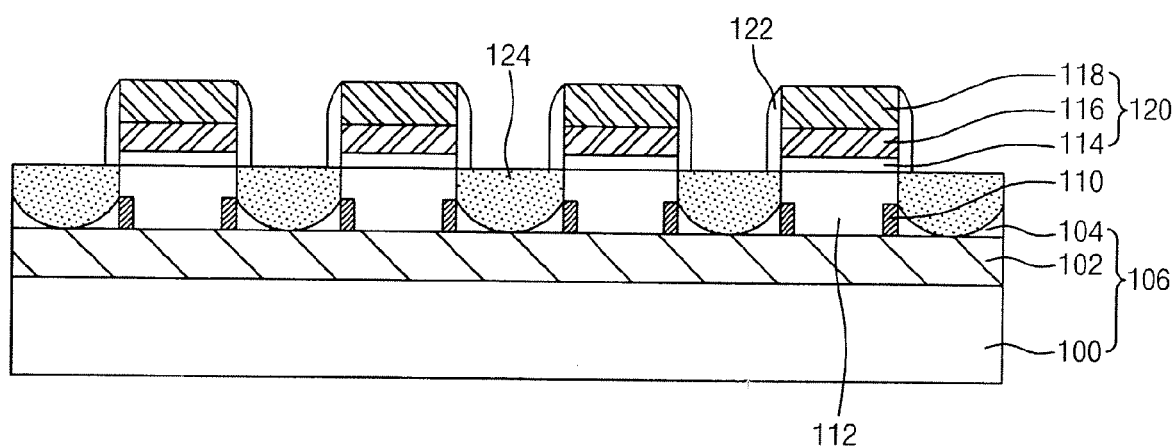

Referring to FIG. 2G, junction areas 124 are formed in the silicon layer 104 on both sides of the gates 120. Preferably, the junction areas 124 are formed such that the lower ends thereof come into contact with the buried oxide layer 102. As such, the portions of the epi-silicon layer 112 under the gates 120 are isolated by the junction areas 124 and the buried oxide layer 102, and as a result, floating bodies are formed.

Thereafter, while not shown in the drawings, by sequentially conducting a series of subsequent well-known processes, the manufacturing process of the SOI device according to the present embodiment is completed.

As is apparent from the above description, in the present invention, a barrier layer is formed on the lower portions of the sidewalls of the grooves defined in an SOI substrate, and an epi-silicon layer is formed to fill the grooves in which the barrier layer is formed. Therefore, in the present invention, the charge storage capacity of the SOI device is improved, a sensing margin is improved, and the threshold voltage of transistors is decreased. Further, in the present invention, the formation of the barrier layer on the lower portions of the sidewalls of the grooves leads to the prevention of a punch-through phenomenon between junction areas, and thus a punch-through margin can be improved, whereby the operational characteristics of cell transistors can be improved.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. An SOI device having an SOI substrate including a stack structure of a silicon substrate, a buried oxide layer, and a silicon layer, the SOI device comprising:

a groove defined within the silicon layer to expose the buried oxide layer;

a barrier layer formed on a sidewall of the groove;

an epi-silicon layer filling the groove including the barrier layer;

a gate formed on the epi-silicon layer; and junction areas formed in the silicon layer on both sides of the gate.

2. The SOI device according to claim 1, wherein the barrier layer is formed on a lower portion of the sidewall of the groove.

3. The SOI device according to claim 1, wherein the barrier layer comprises an oxide layer.

4. The SOI device according to claim 1, wherein the junction areas are formed such that a lower end of each of the junction areas comes into contact with the buried oxide layer.

5. The SOI device according to claim 1, wherein the gate comprises a stack structure of a gate insulation layer, a gate conductive layer, and a gate hard mask layer.

6. The SOI device according to claim 1, wherein gate spacers are formed on both sides of the gate.

7. The SOI device according to claim 1, wherein the groove is defined within the silicon layer to expose an upper surface of the buried oxide layer opposite to the silicon substrate.

8. A method for manufacturing an SOI device having an SOI substrate with a silicon substrate, a buried oxide layer, and a silicon layer, the method comprising the steps of:

etching the silicon layer of the SOI substrate to define a plurality of grooves each exposing the buried oxide layer;

forming a barrier layer on a lower portion of a sidewall of each of the grooves;

forming an epi-silicon layer to fill the grooves and cover the barrier layer of each of the grooves;

forming gates on the epi-silicon layer; and forming junction areas in the silicon layer on both sides. of each of the gates.

9. The method according to claim 8, wherein the barrier layer comprises an oxide layer.

10. The method according to claim 8, wherein the step of forming the barrier layer on the lower portion of a sidewall of each of the grooves comprises the steps of:

depositing the barrier layer on the silicon layer including a surface of each of the grooves;

etching back the barrier layer such that the barrier layer remains on the sidewall of each of the grooves; and removing a portion of the barrier layer formed on an upper portion of the sidewall of each of the grooves.

11. The method according to claim 10, wherein the step of removing the portion of the barrier layer formed on an upper portion of the sidewall of each of the grooves is conducted using a cleaning process.

12. The method according to claim 8, wherein the epi-silicon layer is formed using a selective epitaxial growth process.

13. The method according to claim 8, wherein the junction areas are formed such that a lower end of each of the junction areas comes into contact with the buried oxide layer.

14. The method according to claim 8, further comprising the step of forming gate spacers on both sides of each of the gates.

15. The method according to claim 8, wherein the step of forming the gates comprises the steps of:

sequentially forming a gate insulation layer, a gate conductive layer, and a gate hard mask layer over the SOI substrate;

etching the gate insulation layer, the gate conductive layer, and the gate hard mask layer to form the gates on the epi-silicon layer.

16. The method according to claim 8, wherein the silicon layer of the SOI substrate is etched to define a plurality of grooves each exposing an upper surface of the buried oxide layer opposite to the silicon substrate.

* * * * *